United States Patent
Daubenspeck et al.

(10) Patent No.: US 8,476,762 B2
(45) Date of Patent: Jul. 2, 2013

(54) NI PLATING OF A BLM EDGE FOR PB-FREE C4 UNDERCUT CONTROL

(75) Inventors: Timothy H. Daubenspeck, Colchester, VT (US); Jeffrey P. Gambino, Westford, VT (US); Christopher D. Muzzy, Burlington, VT (US); Wolfgang Sauter, Hinesburg, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/463,879

(22) Filed: May 4, 2012

(65) Prior Publication Data

US 2012/0217636 A1 Aug. 30, 2012

Related U.S. Application Data

(62) Division of application No. 12/948,092, filed on Nov. 17, 2010, now Pat. No. 8,227,333.

(51) Int. Cl.
*H01L 23/48* (2006.01)
(52) U.S. Cl.
USPC .... 257/738; 257/737; 257/797; 257/E23.179; 438/708; 438/709; 438/612; 438/613; 438/614; 438/615; 438/616; 438/617
(58) Field of Classification Search
USPC .. 257/737–738, 797, E23.179; 438/612–617, 438/708, 709
See application file for complete search history.

(56) References Cited

U.S. PATENT DOCUMENTS

| | | |
|---|---|---|
| 5,767,010 A | 6/1998 | Mis et al. |
| 5,937,320 A | 8/1999 | Andricacos et al. |
| 6,111,321 A | 8/2000 | Agarwala |
| 6,222,279 B1 | 4/2001 | Mis et al. |
| 6,293,457 B1 | 9/2001 | Srivastava et al. |
| 6,586,322 B1 | 7/2003 | Chiu et al. |
| 6,613,663 B2 | 9/2003 | Furuya |
| 6,798,050 B1 | 9/2004 | Homma et al. |
| 7,176,583 B2 | 2/2007 | Daubenspeck et al. |
| 7,485,564 B2 | 2/2009 | Daubenspeck et al. |
| 2002/0093096 A1 | 7/2002 | Tago et al. |
| 2003/0155408 A1 | 8/2003 | Fanti et al. |
| 2005/0006765 A1 * | 1/2005 | Kurosawa ...................... 257/735 |
| 2005/0023680 A1 * | 2/2005 | Wang et al. ................... 257/737 |
| 2005/0245061 A1 * | 11/2005 | Satoh et al. ................... 438/613 |

(Continued)

OTHER PUBLICATIONS

U.S. Appl. No. 12/948,092, filed Nov. 17, 2010, Office Action Communication, Dec. 22, 2011, 7 pages.

(Continued)

*Primary Examiner* — Steven Loke
*Assistant Examiner* — Cuong Nguyen
(74) *Attorney, Agent, or Firm* — Gibb & Riley, LLC; David A. Cain, Esq.

(57) ABSTRACT

A structure and a method of manufacturing a Pb-free Controlled Collapse Chip Connection (C4) with a Ball Limiting Metallurgy (BLM) structure for semiconductor chip packaging that reduce chip-level cracking during the Back End of Line (BEOL) processes of chip-join cool-down. An edge of the BLM structure that is subject to tensile stress during chip-join cool down is protected from undercut of a metal seed layer, caused by wet etch of the chip to remove metal layers from the chip's surface and solder reflow, by an electroplated barrier layer, which covers a corresponding edge of the metal seed layer.

16 Claims, 7 Drawing Sheets

U.S. PATENT DOCUMENTS

| | | | |
|---|---|---|---|
| 2007/0111502 | A1 | 5/2007 | Daubenspeck et al. |
| 2007/0184643 | A1* | 8/2007 | Rinne ........................... 438/612 |
| 2008/0194095 | A1 | 8/2008 | Daubenspeck et al. |
| 2009/0079094 | A1* | 3/2009 | Lin .............................. 257/778 |
| 2009/0102032 | A1 | 4/2009 | Schneegans et al. |
| 2009/0127710 | A1 | 5/2009 | Daubenspeck et al. |
| 2009/0152703 | A1 | 6/2009 | Pratt |
| 2009/0163019 | A1 | 6/2009 | Srivastava et al. |

OTHER PUBLICATIONS

U.S. Appl. No. 12/948,092, filed Nov. 17, 2010, Notice of Allowance Communication, Mar. 16, 2012, 13 pages.

IBM, "Fine Pitch PbFree C4 with Offset Edge Preventing BLM Consumption and Undercut", IPCOM000181845D, Apr. 15, 2009, 9 pages.

IBM, "PbFree C4/BLM with Annular Oxide Ring for Dimensional Control and Reliability", IPCOM000181689D, Apr. 9, 2009, 6 pages.

Matthew et al., "Protection of Copper From Intermetallic Copper—Tin Formation for Flipchip Bumping Applications", IPCOM000007639D, Apr. 10, 2002, 6 pages.

* cited by examiner

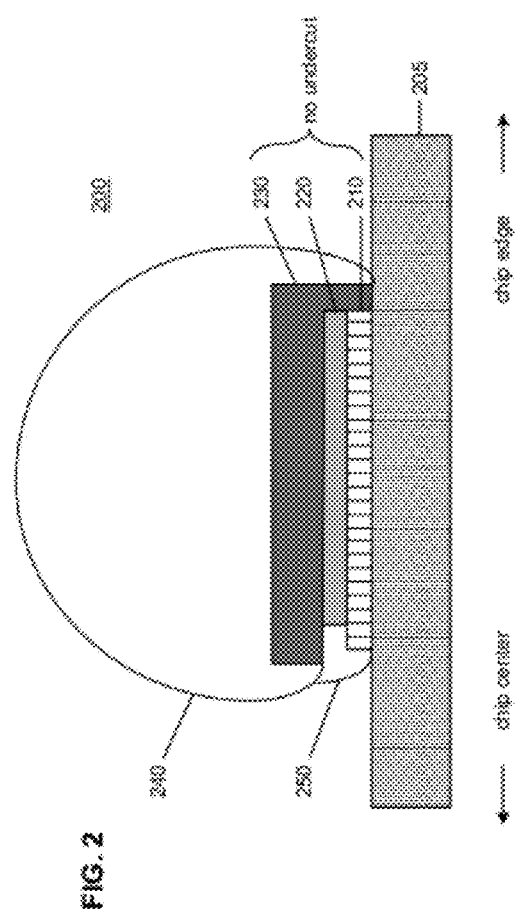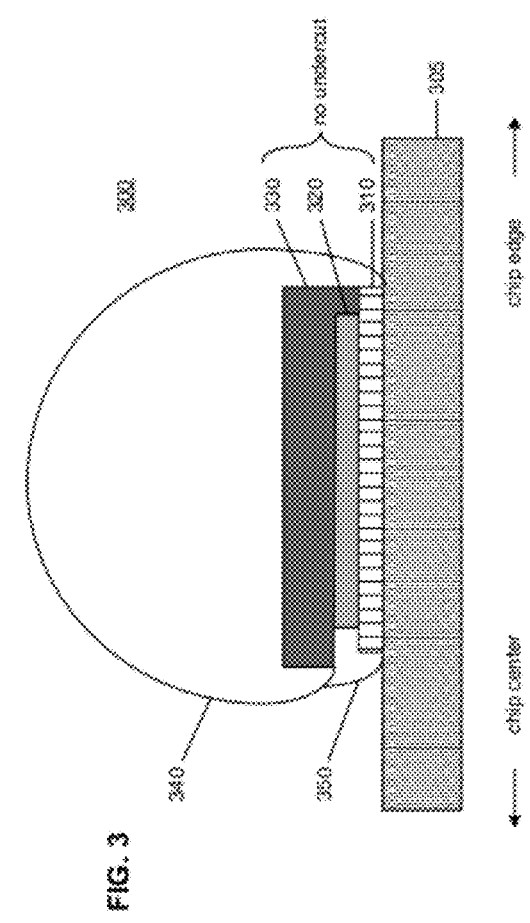

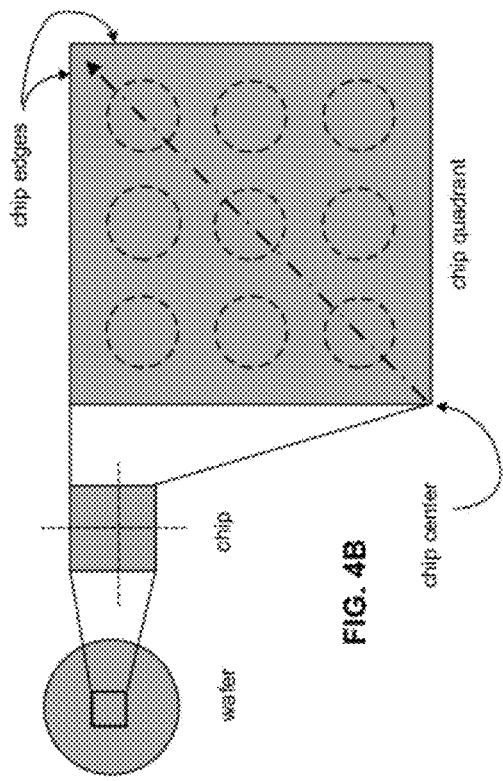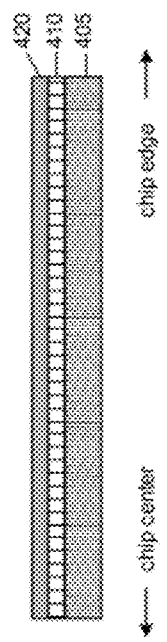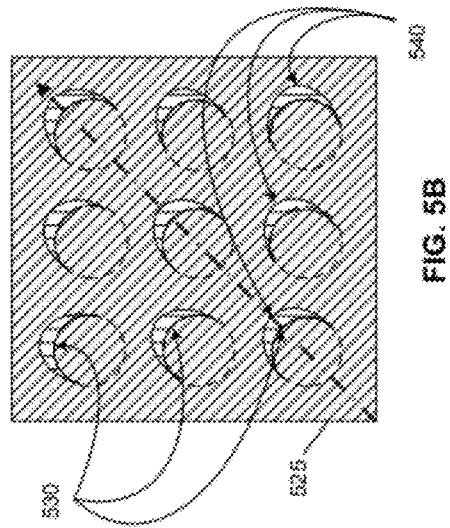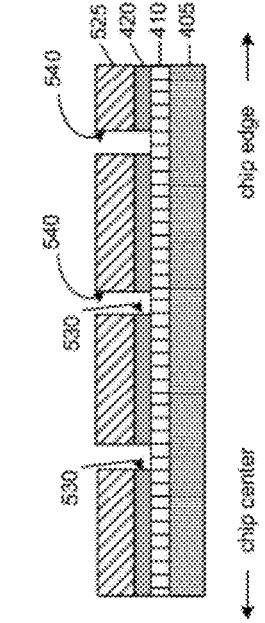
FIG. 4B
FIG. 5B
FIG. 4A
FIG. 5A

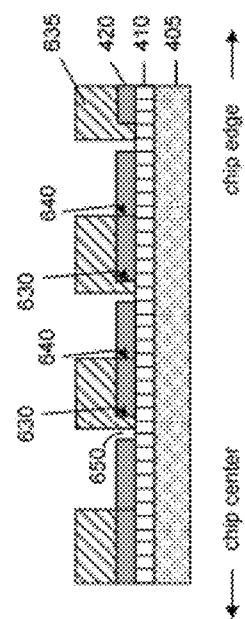 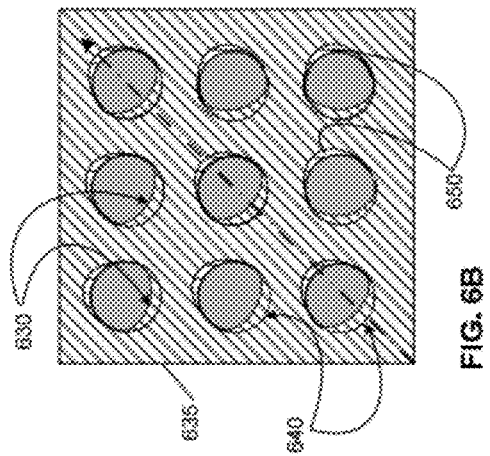
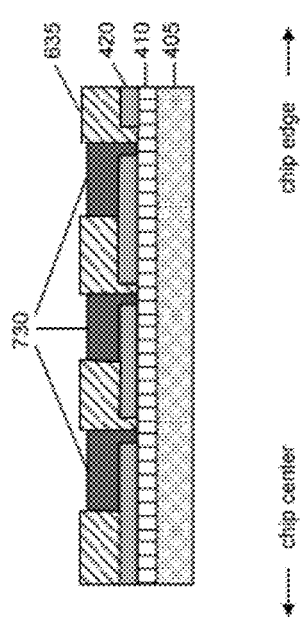 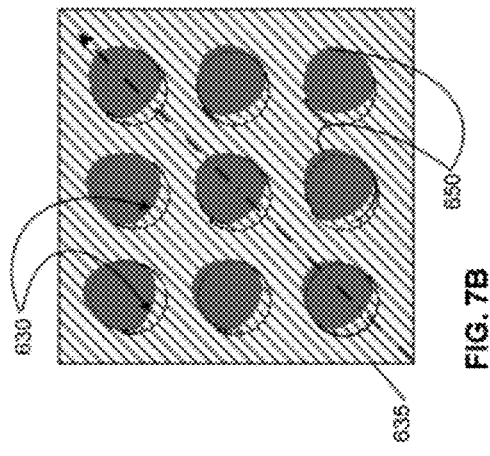

NI PLATING OF A BLM EDGE FOR PB-FREE C4 UNDERCUT CONTROL

CROSS-REFERENCE TO RELATED APPLICATIONS

This application is a divisional of U.S. Pat. No. 8,227,333, Issued Jul. 24, 2012, the complete disclosure of which is incorporated herein by reference.

BACKGROUND

1. Field of the Invention

The present invention generally relates to the packaging of semiconductor chips. In particular, the present invention relates to a structure and a method of manufacturing a Pb-free, Controlled Collapse Chip Connection (C4) with a Ball Limiting Metallurgy (BLM) structure that reduces chip-level back-end-of-line (BEOL) cracking. More particularly, the present invention relates to electroplating of Ni on an exposed edge of a metal seed layer of the BLM structure to reduce undercut of the BLM structure.

2. Description of Related Art

In a Pb-free C4 methodology, formation of solder bumps is accomplished by forming an under bump or Ball Limiting Metallurgy (BLM) structure, comprising a stack of metal layers that are connected by an electrically conductive via to an underlying final metallization layer of a semiconductor chip, and by subsequently forming an overlying solder bump on the BLM structure. Ideally, the BLM structure should provide good adhesion to a passivation layer of the semiconductor chip and to a metallic bonding pad connected by the via to the final metallization layer. The BLM structure also serves as an effective diffusion barrier between the solder bump and the final metallization layer of the semiconductor chip.

Conventionally, Pb-free C4 bump structures include BLM structures that are centered over vias in the passivation layer of a semiconductor chip. The BLM structures can be formed by: depositing a TiW base layer on the passivation layer and walls of its vias; depositing a Cu seed layer over the TiW base layer; forming a patterned photoresist that forms holes, corresponding to each of the BLM structures, over the Cu seed layer; electroplating a Ni barrier layer on the Cu seed layer in each of the holes; electroplating solder over the electroplated Ni barrier layer in each of the holes; stripping the patterned photoresist; wet etching, with the electroplated solder acting as a mask, the TiW base and Cu seed layers surrounding each of the BLM structures; and reflowing the electroplated solder. In an alternative method of forming Pb-free C4 bump structures, a second Cu layer may be electroplated over the Ni barrier layer in each of the holes, before electroplating the solder.

Pb-free C4 bump structures are also formed by a physical transfer of pre-molded solder bumps to the BLM structures, i.e., a C4 New Process (C4NP). The C4NP process is similar to the conventional Pb-free C4 process, described above, except that following the electroplating of Ni, or alternatively, following the electroplating of a second Cu layer, the patterned photoresist mask is first stripped and the pre-molded solder bumps are then physically transferred to the BLM structures. The TiW base and Cu seed layers, surrounding each of the BLM structures, are subsequently wet etched with the physically transferred solder bumps acting as a mask; and finally, the physically transferred solder bumps are reflowed.

During wet etching of the Cu seed and the TiW base layers surrounding the BLM structures, a chemical undercut of 1-2 µm can occur at the edges of the C4 solder bump structures. Upon subsequent reflow of the C4 solder bump structures during the BEOL processes, there is a thermally driven reaction that occurs between the Sn of the solder and any exposed Cu of the Cu seed layer. This thermal reaction consumes Cu, further undercutting the Cu seed layer, and forms a solid intermetallic mixture, which can comprise Sn, Ni, and Cu within the region of the undercut. The thermal undercut can add an additional undercut of 2-5 µm from the edges of the chemically undercut C4 solder bump structure, resulting in the C4 solder bump structure shown in FIG. 1, which indicates a chemical undercut boundary 108 by the lines with small dashes, a chemical and thermal undercut boundary 106 by the solid lines, and the approximate disposition of the intermetallic by the line with large dashes.

The sum of the chemical and thermal undercuts in the standard electroplated C4 process or the standard physical transfer process for solder bumps typically averages about 4-5 µm from the edges of the C4 solder bump structure. However, variations in the chemical and thermal undercut processes can result in a further additional undercut of 4-5 µm. Therefore, a worst-case maximal sum of chemical and thermal undercuts of the solder bump can range from 5 to 10 µm from the edges of the C4 solder bump structure.

Referring to FIG. 1, mechanical tests reveal that the interface 107 between the TiW base layer 102 and the intermetallic 105, formed within the chemical and thermal undercut 106 region during solder reflow, has a low strength, making it susceptible to shear, when compared to the stronger interfaces of the TiW base layer 102 and the passivation layer 101, the TiW base layer 102 and the Cu seed layer 103, the Cu seed layer 103 and the electroplated Ni layer 104, and the electroplated Ni layer 104 and the intermetallic 105.

Chemical and thermal undercutting of solder bumps can result in chip-level cracking during chip-join cool-down BEOL processes. Recent investigations of the chip-level cracking indicate that during chip-join cool-down, solder bumps disposed between the semiconductor chip and the joined packaging laminate are subject to shearing, which results from the different coefficients of thermal expansion for the chip and the laminate.

There remains a need for a Pb-free Controlled Collapse Chip Connection (C4) with a Ball Limiting Metallurgy (BLM) structure and a method of manufacturing a Pb-free C4 with a BLM structure that reduce chip-level cracking during the BEOL processes of chip-join cool-down.

SUMMARY

In view of the foregoing, an exemplary embodiment of the invention disclosed herein provides ball limiting metallurgy (BLM) structure including: a metal seed layer formed on a base layer, the metal seed layer being roughly circular and including a top surface, a first circumferential edge oriented away from a center and toward an outer edge of an underlying semiconductor chip, and a second circumferential edge oriented toward the center; and a barrier metal layer that covers the top surface and the first circumferential edge of the metal seed layer, and does not cover the second circumferential edge of the metal seed layer.

In another exemplary embodiment of the invention a method of forming a ball limiting metallurgy (BLM) structure may include: wet etching a first metal layer through a first patterned resist to remove a first annular section of the first metal layer, the first annular section, which is removed, extending outwardly away from a first circumferential edge of the first metal layer of the BLM structure to an outer edge, the first annular section, which is removed, being oriented toward an edge of the semiconductor chip; stripping the first patterned photoresist; forming a second patterned photoresist on the semiconductor chip, except on a portion of the first annular section, which is removed and adjacent to the first circumferential edge, and except on a portion of the first metal layer bounded by the first circumferential edge and an inner edge of a second annular section of the first metal layer of the BLM structure that extends inwardly from a second circumferential edge of the first metal layer of the BLM structure toward a center of the BLM structure, the second annular section being oriented toward the center of the semiconductor chip; electroplating a second metal layer on the semiconductor chip, such that the second metal layer fills the portion of the first annular section, which is removed and adjacent to the first circumferential edge, and covers the first metal layer from the first circumferential edge to the inner edge of the second annular section; electroplating a solder bump on the second metal layer; stripping the second patterned photoresist; and wet etching of the semiconductor chip, using the electroplated solder bump as a mask, to remove portions of the first metal layer from areas of the semiconductor chip surrounding each BLM structure.

In yet another exemplary embodiment of the invention a method of forming a ball limiting metallurgy (BLM) structure may include: wet etching a first metal layer through a first patterned resist to remove a first annular section of the first metal layer, the first annular section, which is removed, extending outwardly away from a first circumferential edge of the first metal layer of the BLM structure to an outer edge, the first annular section, which is removed, being oriented toward an edge of the semiconductor chip; stripping the first patterned photoresist; forming a second patterned photoresist on the semiconductor chip, except on a portion of the first annular section, which is removed and adjacent to the first circumferential edge, and except on a portion of the first metal layer bounded by the first circumferential edge and an inner edge of a second annular section of the first metal layer of the BLM structure that extends inwardly from a second circumferential edge of the first metal layer of the BLM structure toward a center of the BLM structure, the second annular section being oriented toward the center of the semiconductor chip; electroplating a second metal layer on the semiconductor chip, such that the second metal layer fills the portion of the removed first annular section, which is removed and adjacent to the first circumferential edge, and covers the first metal layer from the first circumferential edge to the inner edge of the second annular section; stripping the second patterned photoresist; transferring a solder bump to the BLM structure; and wet etching the semiconductor chip, using the transferred solder bump as a mask, to remove portions of the first metal layer from areas of the semiconductor chip surrounding each BLM structure.

In yet another exemplary embodiment of the invention a method of forming a ball limiting metallurgy (BLM) structure may include: wet etching a first metal layer through a first patterned resist to remove a first annular section of the first metal layer, the first annular section, which is removed, extending outwardly away from a first circumferential edge of the first metal layer of the BLM structure and toward an edge of the semiconductor chip; stripping the first patterned photoresist; forming a second patterned photoresist on the semiconductor chip, except on a portion of the first annular section, which is removed and adjacent to the first circumferential edge, and except on a portion of the first metal layer that is adjacent to the first circumferential edge; electroplating a second metal layer on the semiconductor chip, such that the second metal layer fills the portion of the removed first annular section, which is removed and adjacent to the first circumferential edge, and covers said portion of said first metal layer; performing one of: forming a solder bump on the second metal layer and subsequently stripping the second patterned photoresist; and stripping the second patterned photoresist and subsequently forming a solder bump on the second metal layer; and wet etching the semiconductor chip, using the solder bump as a mask, to remove portions of the first metal layer from areas of the semiconductor chip surrounding the BLM structure.

BRIEF DESCRIPTION OF THE DRAWINGS

The exemplary embodiments of the invention will be better understood from the following detailed description with reference to the drawings, which are not necessarily drawing to scale and in which:

FIG. 2 is a schematic diagram illustrating a BLM structure on which a reflowed solder ball is formed and in which a first circumferential edge of the metal seed layer is aligned with a corresponding first circumferential edge of the base layer in an exemplary embodiment of the invention;

FIG. 3 is a schematic diagram illustrating a BLM structure on which a reflowed solder ball is formed and in which a circumferential edge of the base layer extends beyond the first circumferential edge of the metal seed layer in an exemplary embodiment of the invention;

FIG. 4A is a schematic diagram illustrating a cross section of a first metal layer formed on a quadrant of a semiconductor chip in an exemplary embodiment of the invention;

FIG. 4B is a schematic diagram illustrating a top view of a disposition of to-be-formed BLM structures on the first metal layer 420 on the quadrant of the semiconductor chip in an exemplary embodiment of the invention;

FIG. 5A is a schematic diagram illustrating a cross section of first annular sections of the first metal layer 420 that have been removed by wet etching through a first patterned photoresist 525 in an exemplary embodiment of the invention;

FIG. 5B is a schematic diagram illustrating a top view of the first annular sections of the first metal layer 420 for that have been removed and their orientations with respect to the center of the underlying semiconductor chip in an exemplary embodiment of the invention;

FIG. 6A is a schematic diagram illustrating a cross section of second patterned photoresist 635 formed within portions of the first annular sections of the first metal layer 420 that have been removed, and formed over circumferential portions of the first metal layer 420 of each BLM structure in an exemplary embodiment of the invention;

FIG. 6B is a schematic diagram illustrating a top view that shows the orientation, with respect to the center of the underlying semiconductor chip, of the second patterned photoresist 635 formed over a portion of the first annular section of the first metal layer 420 that has been removed for each BLM structure, and formed over a circumferential portion of the first metal layer 420 of each BLM structure in an exemplary embodiment of the invention;

FIG. 7A is a schematic diagram illustrating a cross section of an electroplated second metal layer 730 formed on the semiconductor chip in the presence of the second patterned photoresist 635 in an exemplary embodiment of the invention;

FIG. 7B is a schematic diagram illustrating a top view that shows the orientation, with respect to the center of the underlying semiconductor chip, of the electroplated second metal layer 730 of each BLM structure in the presence of the second patterned photoresist 635 in an exemplary embodiment of the invention;

DETAILED DESCRIPTION

Figure 1:
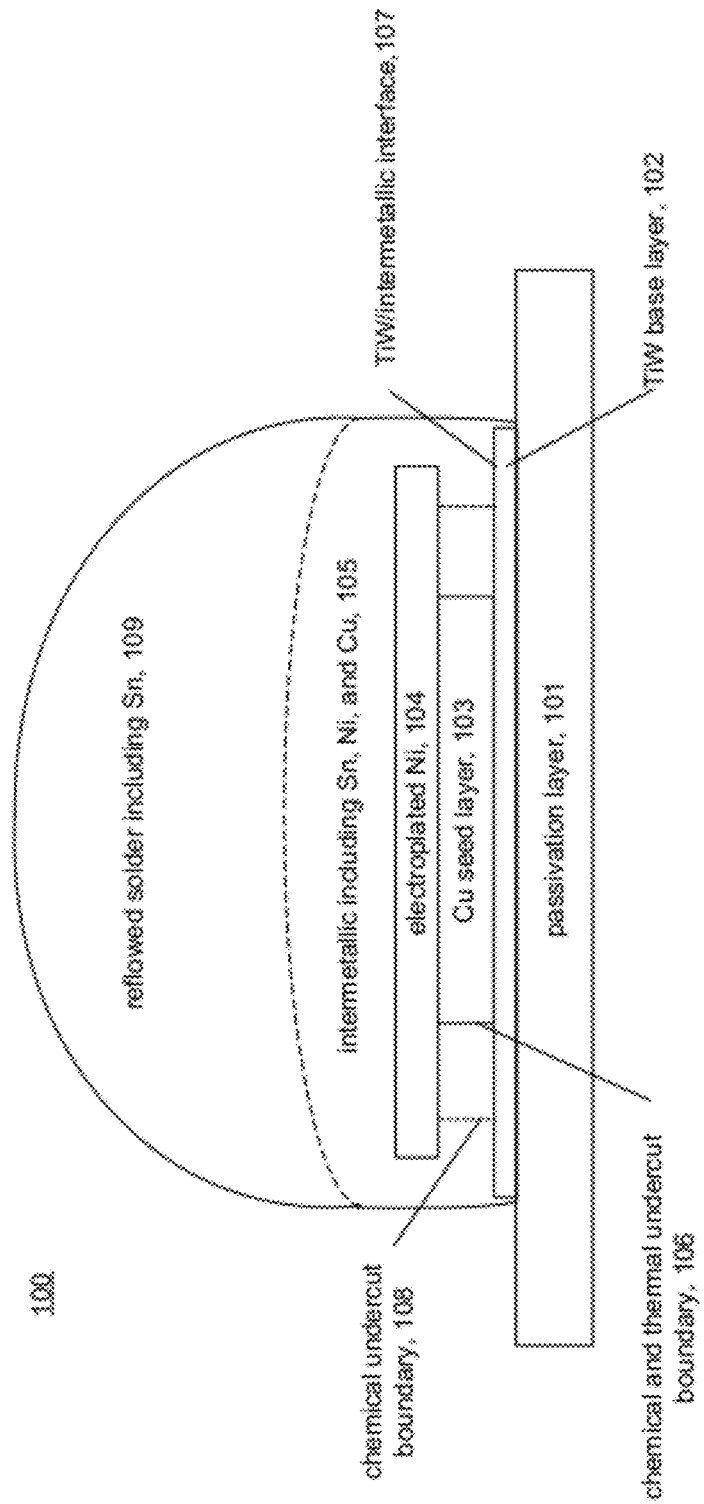
FIG. 1 is a schematic diagram illustrating a Ball Limiting Metallurgy (BLM) structure on which a reflowed solder ball is formed in the prior art.

The exemplary embodiments of the invention and the various features and advantageous details thereof are explained more fully with reference to the non-limiting exemplary embodiments that are illustrated in the accompanying drawings and detailed in the following description. It should be noted that the features illustrated in the drawings are not necessarily drawn to scale. Descriptions of well-known materials, components, and processing techniques are omitted so as to not unnecessarily obscure the exemplary embodiments of the invention. The examples used herein are intended to merely facilitate an understanding of ways in which the exemplary embodiments of the invention may be practiced and to further enable those of skill in the art to practice the exemplary embodiments of the invention. Accordingly, the examples should not be construed as limiting the scope of the exemplary embodiments of the invention.

As described above, there remains a need for a Pb-free Controlled Collapse Chip Connection (C4) with a Ball Limiting Metallurgy (BLM) structure and a method of manufacturing a Pb-free C4 with a BLM structure that may reduce chip-level cracking during the BEOL processes of chip-join cool-down.

Recent investigations of chip-level cracking indicate that "white bumps", i.e., chip-level manufacturing defects visualized by acoustic imaging, are primarily located on an edge of a solder bump that may be subject to a tensile stress during chip-join cool-down.

Further investigations of chip-level cracking of a Pb-free C4 with a BLM structure have entailed two-dimensional finite element modeling (FEM) of the mechanical stresses applied to a solder ball during cool-down at chip-join. The two-dimensional FEM indicates that the solder ball is subject to a rotational shear, caused by the different coefficients of thermal expansion of the semiconductor chip and the joined packaging laminate, both of which are mechanically connected to the solder ball during chip-join cool-down. This rotational shear may transmit a tensile stress from one edge of the solder bump into the underlying semiconductor chip that can delaminate and damage the BLM structure, while an opposing edge of the solder bump may be subject to a compressive stress.

In the two-dimensional finite element model of the BLM structure and underlying semiconductor chip, the chemical and thermal undercut of the Cu seed layer, which is located above the weak TiW/intermetallic interface, may be simulated by a "crack". In the model, increasing the undercut, i.e., the physical extent of the "crack", may increase the amount of stress propagated into the BLM structure and the semiconductor chip by thermally-induced shear. In addition, the two-dimensional FEM indicates that tensile and compressive stresses propagated into the BLM structure and the semiconductor chip may be influenced by the orientation of each BLM structure relative to the center of the semiconductor chip, as the tensile and compressive stresses produced by the different coefficients of expansion for the semiconductor chip and the packaging laminate during chip-join cool-down are directed outwardly and inwardly, respectively, relative to the center of the chip for each BLM structure. Within an array of undercut BLM structures disposed on the semiconductor chip, the two-dimensional FEM indicates that a section of a circumferential edge of a BLM structure, coinciding with the weak TiW/intermetallic interface and being oriented in an outward radial direction from the center of the semiconductor chip, may be subject to a damaging tensile stress.

Thus, the problem to be solved by various exemplary embodiments of the invention is how to prevent damaging tensile stresses caused by a weak TiW/intermetallic interface coinciding with the chemical and thermal undercut of the Cu seed layer of a BLM structure, while preserving the Cu seed layer for subsequent electroplating in the formation of the BML structure.

Referring to FIG. 2, a cross-section of a final BEOL structure 200 may illustrate a reflowed solder ball 240, a BLM structure of an exemplary embodiment of the invention, and a passivation layer 205 of a semiconductor chip. In a top view (not shown), the BLM structure may be roughly circular. The BLM structure may include a base layer 210 comprising, for example, TiW, which is formed on the passivation layer 205. A metal seed layer 220 of the BLM structure, comprising, for example, Cu, may be formed on the base layer 210. In an exemplary embodiment of the invention, the metal seed layer 220 may have a first circumferential edge that is oriented away from a center and toward an outer edge of the underlying semiconductor chip and that may be aligned with a first circumferential edge of the base layer 210, which is also oriented away from the center and toward the outer edge of the semiconductor chip. The first circumferential edges of the base layer 210 and the metal seed layer 220 correspond to those edges of the final BEOL structure 200, which may be subject to tensile stress during chip-join cool-down. In an exemplary embodiment of the invention, a barrier metal layer 230 of the BLM structure comprising, for example, Ni, a Ni alloy including any of Cr, Zn, Ag, and Au, and any of Cr, Zn, Ag, Au, and their alloys, may cover the first circumferential edge of the metal seed layer 220 and the first circumferential edge of the base layer 210, preventing undercut of the metal seed layer 220 at the first circumferential edge during the BEOL processes of wet etch and solder reflow to form the final BEOL structure 200. The barrier metal layer 230 may also cover a top surface of the metal seed layer 230. The reflowed solder ball 240 may comprise any of a Sn-containing Pb-free solder, a Sn alloy-containing Pb-free solder, and a Pb-free solder.

By preventing undercut of an edge of the BLM structure, formation of a mechanically weak interface within an undercut region during wet etch and solder reflow is avoided. Thus, an edge of the final BEOL structure 200, oriented toward an outer edge of the underlying semiconductor chip, may be subject to tensile stress without delamination or damage.

Second circumferential edges of the base layer 210 and the metal seed layer 220 are oriented opposite to the first circumferential edges, i.e., toward the center of the semiconductor chip, and correspond to edges that may be subject to compressive stress during chip-join cool-down. Compressive stress may not cause delamination or damage to the final BEOL structure 200. Hence, the second circumferential edges of the base layer 210 and the metal seed layer 220 may not be covered by the barrier metal layer 230 in an exemplary embodiment of the invention. Thus, undercut of the base layer 210 and metal seed layer 220 may occur at their second circumferential edges with formation of an intermetallic 250 in an undercut region that underlies a reflowed solder ball 240.

Referring to FIG. 3, a cross-section of a final BEOL structure 300 may illustrate a reflowed solder ball 340, a BLM structure of another exemplary embodiment of the invention, and a passivation layer 305 of the semiconductor chip. In a top view (not shown), the BLM structure may be roughly circular. The BLM structure may include a base layer 310 comprising, for example, TiW, formed on the passivation layer (101) 305. A metal seed layer 320 of the BLM structure, comprising, for example, Cu, may be formed on the base layer 310. The metal seed layer 320 may have a first circumferential edge that is oriented away from a center and toward an outer edge of the underlying semiconductor chip. The base layer 310 may also have a first circumferential edge that extends beyond the first circumferential edge of the metal seed layer 320 and that is also oriented away from the center and toward an outer edge of the underlying semiconductor chip. The first circumferential edges of the base layer 310 and the metal seed layer 320 correspond to those edges of the final BEOL structure 300, which may be subject to tensile stress during chip-join cool-down. In an exemplary embodiment of the invention, a barrier metal layer 330 of the BLM structure comprising, for example, Ni, a Ni alloy including any of Cr, Zn, Ag, and Au, and any of Cr, Zn, Ag, Au, and their alloys, may cover the first circumferential edge of the metal seed layer 320, preventing undercut of the metal seed layer 320 at the first circumferential edge during the BEOL processes of wet etch and solder reflow. The barrier metal layer 330 may also cover a top surface of the metal seed layer 330. The reflowed solder ball 340 may comprise any of a Sn-containing Pb-free solder, a Sn alloy-containing Pb-free solder, and a Pb-free solder.

By preventing undercut of an edge of the BLM structure, formation of a mechanically weak interface within an undercut region during wet etch and solder reflow is avoided. Thus, an edge of the final BEOL structure 300, oriented toward an edge of the underlying semiconductor chip, may be subject to tensile stress without delamination or damage.

Second circumferential edges of the base layer 310 and the metal seed layer 320 are oriented opposite to the first circumferential edges, i.e., toward the center of the semiconductor chip, and correspond to edges that may be subject to compressive stress during chip-join cool-down as indicated by the FEM. Compressive stress may not cause delamination or damage to the final BEOL structure 300. Hence, the second circumferential edges of the base layer 310 and the metal seed layer 320 may not be covered by the barrier metal layer 330 in an exemplary embodiment of the invention. Thus, undercut of the base layer 310 and metal seed layer 320 may occur at their second circumferential edges with formation of an intermetallic 350 in an undercut region underlying a reflowed solder ball 340.

Various methods of forming a ball limiting metallurgy (BLM) structure on a quadrant of a semiconductor chip are illustrated in FIGS. 4A-B, 5A-B, 6A-B, and 7A-B for various exemplary embodiments of the invention. Although FIGS. 5A-B, 6A-B, and 7A-B illustrate various structures resulting from the processes of forming BLM structures on one quadrant of the semiconductor chip, it is understood that the processes of forming BLM structures on the remaining quadrants of the semiconductor chip are identical with the exception of the particular orientation of some structures.

Referring to FIGS. 4A-B, FIG. 4A illustrates a cross section and FIG. 4B a top view of an upper right quadrant of a semiconductor chip upon which a BLM structure is to be formed. FIG. 4B also illustrates the relationships of the upper right quadrant of the semiconductor chip to the semiconductor chip, and of the semiconductor chip to a wafer, which may contain a number of semiconductor chips. Further illustrated in FIG. 4B, is the center of the semiconductor chip, which corresponds to the lower left corner of the upper right quadrant of the semiconductor chip. Thus, the arrow depicted in the upper right quadrant of the semiconductor chip shown in FIG. 4B, and similarly, in each of FIGS. 5B, 6B, and 7B, is outwardly directed from the center of the semiconductor chip toward an edge of the semiconductor chip, and may correspond to an edge of underlying BLM structure to which a tensile stress may be subsequently applied during chip-join cool-down in exemplary embodiments of the invention.

Referring to the cross section of FIG. 4A, a BLM structure may comprise a stack of metal layers formed on a semiconductor chip. A base layer 410 may be deposited on a passivation layer (101) 405 of the semiconductor chip. The base layer 410 may comprise TiW and may be deposited on the passivation layer 405 by plasma vapor deposition (PVD) sputtering. The passivation layer 405 may comprise an organic compound, such as a polyimide, and may include a pattern of vias corresponding to, for example, a 3on6 pitch of the BLM structures formed on the semiconductor chip. A first metal layer 420 may be deposited on the base layer 410 as shown in FIG. 4A. The first metal layer 420 may comprise a Cu seed layer deposited on the base layer 410 by a PVD sputtering process.

Referring to the top view of FIG. 4B, the first metal layer 420 may cover the underlying semiconductor chip. The dashed circles of FIG. 4B may indicate a pattern of BLM structures that corresponds to a pattern of vias within the passivation layer 405 in an exemplary embodiment of the invention. Each dashed circle of FIG. 4B may represent a circumferential edge of the first metal layer 420 of each BLM structure before the BEOL processes of wet etch and solder reflow.

As illustrated in FIGS. 5A-B, the first metal layer 420 may be wet etched through a first patterned photoresist 525 to expose sections of the base layer 410 in an exemplary embodiment of the invention. Each of the patterned sections of the base layer 410 may form an etched annular section comprising, for example, an annular crescent or an annular ring, which is adjacent to each of the BLM structures that are to be formed.

Referring to the cross section of FIG. 5A, which is aligned with the arrow of FIG. 5B, wet etching through the first patterned photoresist 525 may remove a first annular section of the underlying first metal layer 420, in which the first annular section that is removed extends outwardly from a first circumferential edge 530 of the first metal layer of the BLM structure to an outer edge 540 in an exemplary embodiment of the invention. Alternatively, wet etching through the first patterned photoresist 525 may also remove a corresponding first annular section of the base layer 410 to expose a portion of the underlying passivation layer 405 (not shown). In FIG. 5A, a distance, along the direction of the arrow of FIG. 5B, between the first circumferential edge 530 and the outer edge 540 of the first annular section that is removed may be about 1 μm to about 2 μm in an exemplary embodiment of the invention. A pitch between adjacent BLM structures and thus, first annular sections that are removed may be about 150 μm.

Referring to the top view of FIG. 5B, each first annular section that is removed may extend outwardly from a first circumferential edge 530 of the first metal layer 420 of each BLM structure to an outer edge of the first annular section 540 that is removed in an exemplary embodiment of the invention. Each first circumferential edge 530 of the first metal layer 420 of each BLM structure may correspond to an oriented section of the circumference of the first metal layer 420 of each BLM structure before BEOL wet etch and solder reflow. Each first annular section that is removed may comprise, for example, an annular crescent or an annular ring, that may correspond to about ½ to about ¾ of the circumference of the first metal layer 420 of each BLM structure before BEOL wet etch and solder reflow in an exemplary embodiment of the invention. The first circumferential edge 530 of the first metal layer 420 of each BLM structure, which is to be formed, may correspond to a BLM structure having a diameter of about 2 μm to about 20 μm in an exemplary embodiment of the invention.

The orientation of each first annular section that is removed by the first patterned photoresist 525 of FIG. 5B may extend outwardly, being directed from the lower left corner of the exemplary quadrant, which corresponds to the center of the semiconductor chip, toward the upper or right-most edges of the quadrant, which correspond to outer edges of the semiconductor chip. Similarly, each of the remaining three quadrants of the semiconductor chip may also include a pattern of first annular sections formed by wet etching through correspondingly similar first patterned photoresists, in which each pattern of first annular sections is also outwardly directed from a corner of the quadrant, which corresponds to the center of the semiconductor chip. The formation of first patterned photoresists for a pattern of first annular sections for each quadrant of each semiconductor chip on a wafer may follow an algorithmic process well known to those in the art.

Following the wet etching of the semiconductor chip through the first patterned photoresist 525, the first patterned photoresist 525 is stripped to expose the underlying first metal layer 420 and portions of the base layer 410, corresponding to the first annular sections that were removed by wet etching through the first metal layer 420, or alternatively, portions of the passivation layer (101) 405, corresponding to the first annular sections that were removed by wet etching through the first metal layer 420 and the base layer 410 (not shown).

As illustrated in FIGS. 6A-B, following stripping of the first patterned photoresist 525, a second patterned photoresist 635 may be formed on the semiconductor chip, except over portions of the base layer 410, corresponding to portions of the removed annular sections of the first metal layer 420 that are adjacent to each BLM structure, and except over a portion of the first metal layer 420 bounded by the first circumferential edge 530 and an inner edge 630 of a second annular section of the first metal layer 420 of each BLM structure that extends from a second circumferential edge 640 of each BLM structure toward a center of each BLM structure.

Referring to the cross section of FIG. 6A, which is aligned with the arrow of FIG. 6B, the second patterned photoresist 635 may be formed between adjacent BLM structures, where each BLM structure is delimited by the first circumferential edge 530 and a second circumferential edge 640, which together form the circumference of the first metal layer 420 of each BLM structure before BEOL wet etch and solder reflow. The second patterned photoresist 635 may extend from the second circumferential edge 640 of each BLM structure to an inner edge 630 of the second annular section of the first metal layer 420 of each BLM structure. In FIG. 6A, a remaining portion of the first metal layer 420 of each BLM structure that is not covered by the second patterned photoresist 635 may provide a highly conductive metal site for subsequent electroplating.

Referring to the top view of FIG. 6B, a portion of the base layer, corresponding to a portion of the first annular section that was removed and is adjacent to the first circumferential edge of the first metal layer 420 each BLM structure, and a portion of the first metal layer 420 of each BLM structure may not be covered by the second patterned photoresist 635 in an exemplary embodiment of the invention. However, the second patterned photoresist 635 may cover the second annular section of the first metal layer 420 of each BLM structure. The second annular section of the first metal layer 420 may comprise an annular crescent or a second section of an annular ring that is oriented toward the center of the semiconductor chip. The second annular section, which is covered by the second patterned photoresist 635, may be bounded by the second circumferential edge 640 and the inner edge 630 of the first metal layer 420 of each BLM structure. Thus, a portion of the first metal layer 420 bounded by the first circumferential edges 530 of the BLM structure and the inner edge 630 of the second annular section of the first metal layer 420 of the BLM structure, may provide a highly conductive metal sites for subsequent electroplating of each of the BLM structures as shown in FIG. 6B.

As illustrated in FIGS. 7A-B, following the forming of the second patterned photoresist 635, a second metal layer 730 may be electroplated on the semiconductor chip, such that the second metal layer 730 fills the portion of the first annular section that is adjacent to the first circumferential edge 530 of the BLM structure, and covers the portion of the first metal layer 420 bounded by the first circumferential edge 530 of the BLM structure and the inner edge 630 of the second annular section of the first metal layer 420 of the BLM structures. The electroplated second metal layer 730 may comprise Ni, a Ni alloy including any of Cr, Zn, Ag, and Au, and any of Cr, Zn, Ag, Au, and their alloys.

Referring to FIG. 7A, a cross section aligned with the arrow of FIG. 6B illustrates that each BLM structure, comprising a base layer 410, a first metal layer 420 and an electroplated second metal layer 730, may be isolated from surrounding BLM structures by the second patterned photoresist 635 in an exemplary embodiment of the invention. In addition, electroplating of the second metal layer 730 on each BLM structure may be facilitated by that portion of the first metal layer 420, which is not covered by the second patterned photoresist 635 for each BLM structure. The electroplated second metal may have a thickness of about 2 μm.

Referring to FIG. 7B, a top view illustrates a pattern of portions of the electroplated second metal layer 730, corresponding to underlying BLM structures, in which a first circumferential edge 530 of the first metal layer 420 of each BLM structure that may be subject to tensile stress during BEOL chip-join cool-down may be protected from subsequent BEOL chemical and thermal undercut by the electroplated second metal layer 730. On the other hand, a second circumferential edge 640 of the first metal layer 420 of each BLM structure, which is oriented toward the center of the semiconductor chip and is subject to compressive stress during BEOL chip-join cool-down, is not protected from subsequent BEOL chemical and thermal undercut by the electroplated second metal layer 730.

In an exemplary embodiment of the invention that may include the processes and structures described above, a Pb-free C4 with BLM structure may be formed by the additional processes of: electroplating any of a Sn-containing Pb-free solder, a Sn alloy-containing Pb-free solder, and a Pb-free solder on the patterned electroplated second metal layer 730 shown in FIG. 7B; stripping the second patterned photoresist 635 shown in FIG. 7B; and wet etching for a second time, using the electroplated solder as a mask, the semiconductor chip to remove portions of the first metal layer 420 and a base layer 410 from areas of the semiconductor chip surrounding the BLM structure. The second wet etching may result in chemical undercut of the first metal layer 420 at an edge of the BLM structure that is oriented toward the center of the semiconductor chip and may be subject to compressive stress during the subsequent BEOL processes of chip-join cool-down, while a first circumferential edge 530 of the first metal layer 420 of the BLM structure that may be subject to a tensile stress is not subject to chemical undercut.

In another exemplary embodiment of the invention that may include the processes and structures described above, a Pb-free C4 with BLM structure may be formed by the additional processes of: stripping the second patterned photoresist 635 shown in FIG. 7B; physically transferring any of a pre-formed Sn-containing Pb-free solder bump, a pre-formed Sn alloy-containing Pb-free solder bump, and a pre-formed Pb-free solder bump to the patterned electroplated second metal layer 730 shown in FIG. 7B; and wet etching for a second time, using the physically transferred solder as a mask, the semiconductor chip to remove portions of the first metal layer 420 and the base layer 410 from areas of the semiconductor chip surrounding the BLM structure. As above stated above, the second wet etching may result in chemical undercut of the first metal layer 420 at an edge of the BLM structure, which is oriented toward the center of the semiconductor chip and is subject to compressive stress during the subsequent BEOL processes of chip-join cool-down, while a first circumferential edge 530 of the first metal layer 420 of the BLM structure that may be subject to a tensile stress is not subject to chemical undercut.

Figure 8:
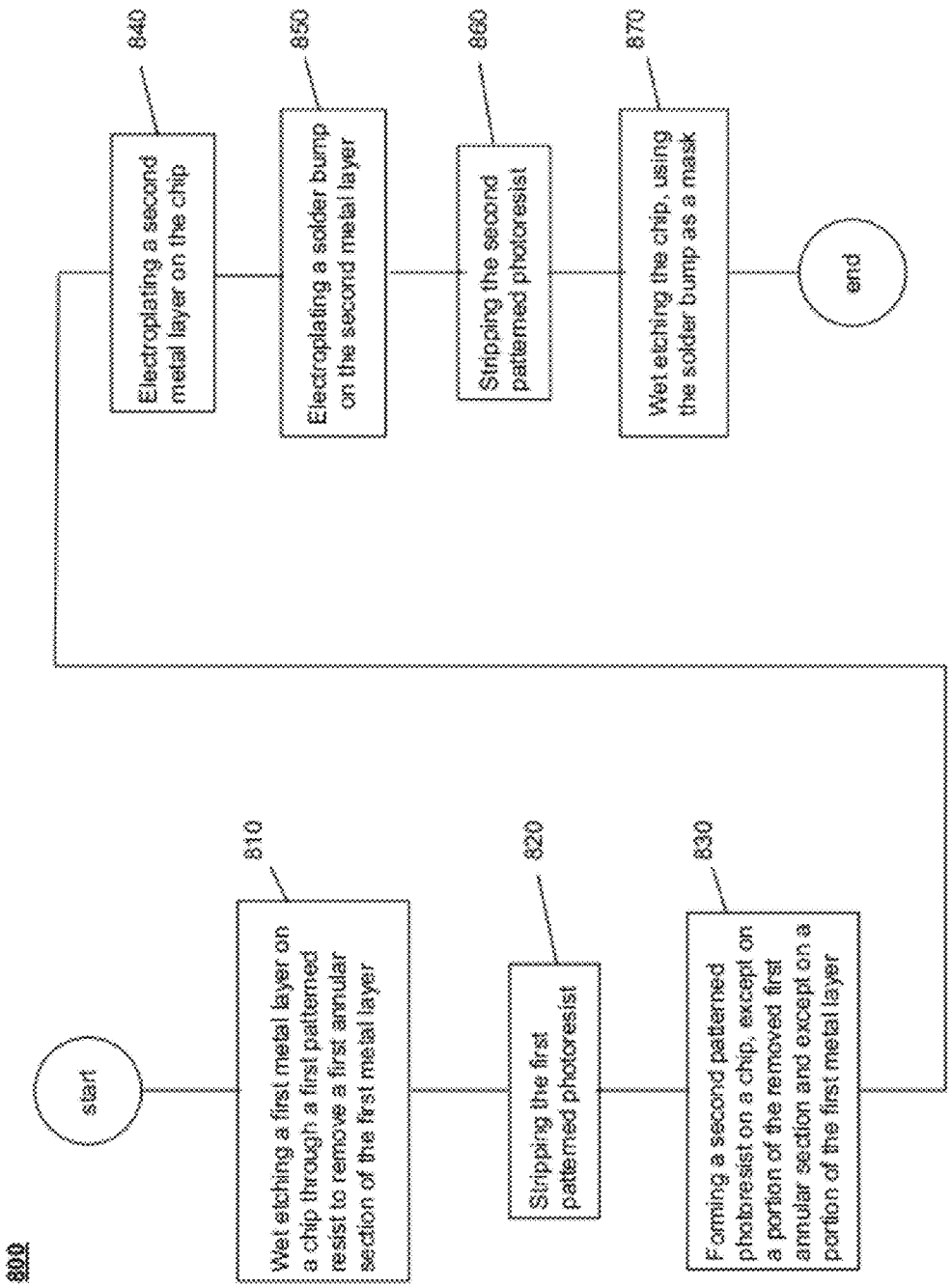
FIG. 8 is a flow chart illustrating a method of forming a BLM structure in which a solder bump is subsequently electroplated on the BLM structure in an exemplary embodiment of the invention.

Referring to FIG. 8, an exemplary method of forming a BLM structure of the invention 800 may include: wet etching a first metal layer through a first patterned resist to remove a first annular section of the first metal layer, in which the first annular section that is removed, extends outwardly away from a first circumferential edge of the first metal layer of the BLM structure to an outer edge and is oriented toward an edge of the underlying semiconductor chip 810; stripping the first patterned photoresist 820; forming a second patterned photoresist on the semiconductor chip, except on a portion of the first annular section that is removed and is adjacent to the first circumferential edge, and except on a portion of the first metal layer bounded by the first circumferential edge and an inner edge of a second annular section of the first metal layer of the BLM structure that extends inwardly from a second circumferential edge of the first metal layer of the BLM structure toward a center of the BLM structure, in which the second circumferential edge is oriented toward the center of the semiconductor chip 830; electroplating a second metal layer on the semiconductor chip, such that the second metal layer fills the portion of the first annular section that is removed and is adjacent to the first circumferential edge of the first metal layer of the BLM structure and covers the first metal layer of the BLM structure from the first circumferential edge to an inner edge of the second annular section of the first metal layer 840; electroplating a solder bump on the second metal layer 850; stripping the second patterned photoresist 860; and wet etching the semiconductor chip for a second time, using the electroplated solder bump as a mask, to remove portions of the first metal layer from areas of the semiconductor chip surrounding each BLM structure 870.

Figure 9:
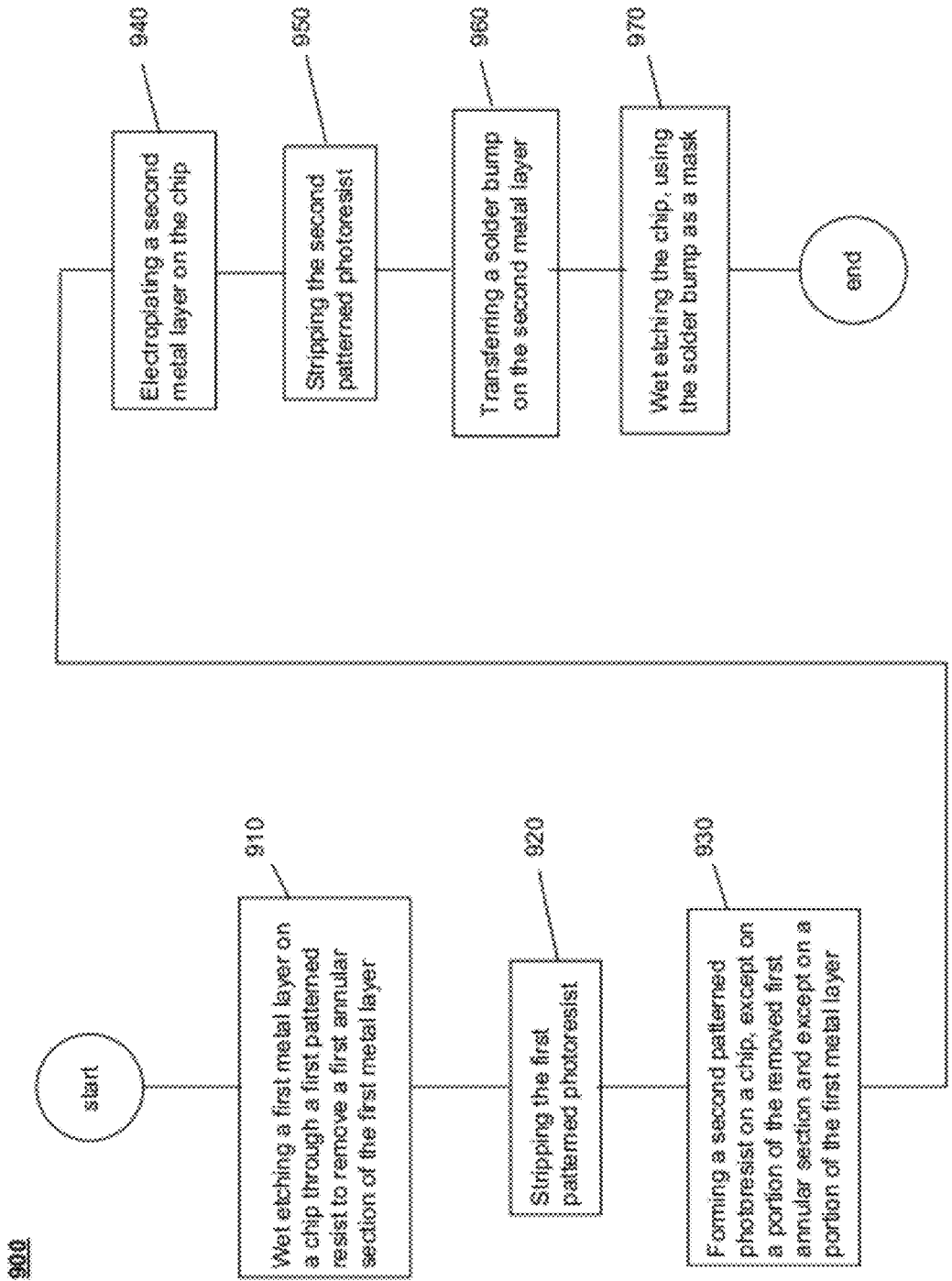
FIG. 9 is a flow chart illustrating a method of forming a BLM structure in which a solder bump is subsequently transferred to the BLM structure in an exemplary embodiment of the invention.

Referring to FIG. 9, an exemplary method of forming a BLM structure of the invention 900 may include: wet etching a first metal layer through a first patterned resist to remove a first annular section of the first metal layer, in which the first annular section that is removed, extends outwardly away from a first circumferential edge of the first metal layer of the BLM structure to an outer edge and is oriented toward an edge of the underlying semiconductor chip 910; stripping the first patterned photoresist 920; forming a second patterned photoresist on the semiconductor chip, except on a portion of the first annular section that is removed and is adjacent to the first circumferential edge, and except on a portion of the first metal layer bounded by the first circumferential edge and an inner edge of a second annular section of the first metal layer of the BLM structure that extends inwardly from a second circumferential edge of the first metal layer of the BLM structure toward a center of the BLM structure, in which the second circumferential edge is oriented toward the center of the semiconductor chip 930; electroplating a second metal layer on the semiconductor chip, such that the second metal layer fills the portion of the first annular section that is removed and is adjacent to the first circumferential edge of the first metal layer of the BLM structure and covers the first metal layer from the first circumferential edge to the inner edge of the second annular section of the first metal layer 940; stripping the second patterned photoresist 950; transferring a solder bump to the BLM structure 960; and wet etching the semiconductor chip for a second time, using the transferred solder bump as a mask, to remove portions of said first metal layer from areas of said semiconductor chip surrounding each BLM structure 970.

Figure 10:
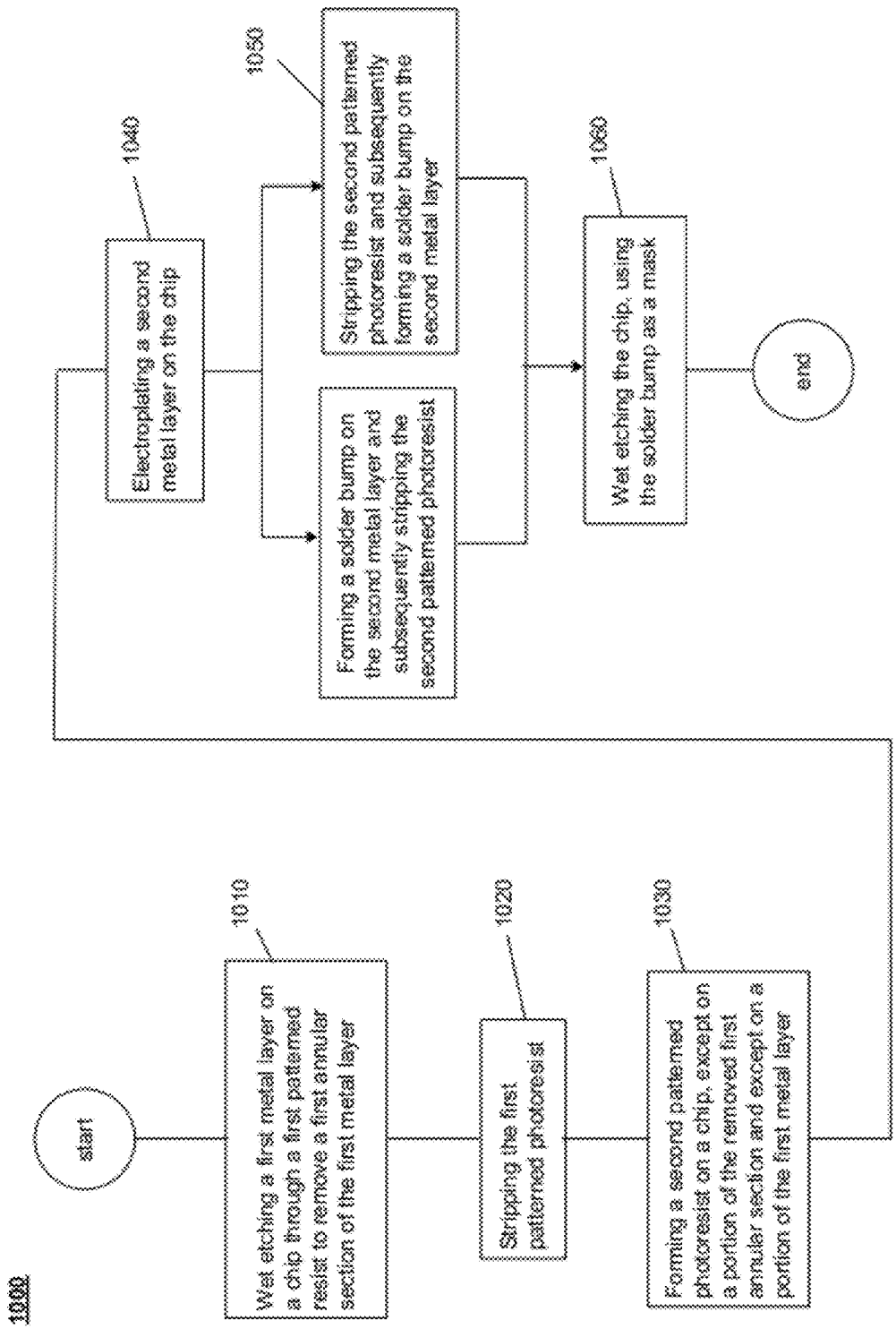
FIG. 10 is a flow chart illustrating a method of forming a BLM structure on which a solder bump is subsequently formed in an exemplary embodiment of the invention.

Referring to FIG. 10, an exemplary method of forming a BLM structure of the invention 1000 may include: wet etching a first metal layer through a first patterned resist to remove a first annular section of the first metal layer, in which the first annular section that is removed, extends outwardly away from a first circumferential edge of the first metal layer of said BLM structure and toward an edge of the semiconductor chip 1010; stripping the first patterned photoresist 1020; forming a second patterned photoresist on the semiconductor chip, except on a portion of the first annular section that is removed and is adjacent to the first circumferential edge, and except on a portion of the first metal layer that is adjacent to the first circumferential edge 1030; electroplating a second metal layer on the semiconductor chip, such that the second metal layer fills the portion of the first annular section that is removed and covers the portion of the first metal layer that is adjacent to the first circumferential edge 1040; performing one of: forming a solder bump on the second metal layer and subsequently stripping the second patterned photoresist, and stripping the second patterned photoresist and subsequently forming a solder bump on the second metal layer 1050; and wet etching the semiconductor chip for a second time, using the solder bump as a mask, to remove portions of the first metal layer from areas of the semiconductor chip surrounding the BLM structure 1060.

What is claimed is:

1. A ball limiting metallurgy (BLM) structure comprising:
a roughly circular metal seed layer disposed directly on a roughly circular metal base layer that is disposed directly on a passivation layer of an underlying semiconductor chip, said roughly circular metal seed layer including a top surface, a first section of a circumferential lateral edge oriented outwardly in a radial direction from a center of said underlying semiconductor chip and toward an outer edge of said underlying semiconductor chip, and a second section of said circumferential lateral edge oriented toward said center of said underlying semiconductor chip; and a barrier metal layer that completely covers and directly contacts said top surface and said first section of said circumferential lateral edge of said roughly circular metal seed layer, and does not directly contact said second section of said circumferential lateral edge of said roughly circular metal seed layer.

2. The BLM structure of claim 1, wherein said second section of said circumferential lateral edge is disposed in an undercut region.

3. The BLM structure of claim 1, wherein said roughly circular metal seed layer comprises Cu, said roughly circular metal base layer comprises TiW, and said barrier metal layer comprises Ni, a Ni alloy including any of Cr, Zn, Ag, and Au, and any of Cr, Zn, Ag, Au, and their alloys.

4. The BLM structure of claim 1, wherein:
said first section of said circumferential lateral edge of said roughly circular metal seed layer is aligned with a corresponding first section of a circumferential lateral edge of said roughly circular metal base layer.

5. The BLM structure of claim 4, wherein:
said barrier metal layer covers said corresponding first section of said circumferential lateral edge of said roughly circular metal base layer.

6. The BLM structure of claim 1, wherein a reflowed solder ball comprising any of a Sn-containing Pb-free solder, a Sn alloy-containing Pb-free solder, and a Pb-free solder, is disposed directly upon said barrier metal layer.

7. A structure, comprising:
a semiconductor chip including a topmost passivation layer; and
a ball limiting metallurgy (BLM) structure, comprising:
a roughly circular metal base layer disposed directly on said topmost passivation layer;
a roughly circular metal seed layer disposed directly on said roughly circular metal base layer, said roughly circular metal seed layer including a top surface, a first section of a circumferential lateral edge oriented outwardly in a radial direction from a center of said semiconductor chip, and a second section of said circumferential lateral edge oriented inwardly toward said center; and
a barrier metal layer completely that covers and directly contacts said top surface and said first section of said circumferential edge and does not directly contact said second section of said circumferential lateral edge of said roughly circular metal seed layer.

8. The BLM structure of claim 7, wherein said second section of said circumferential lateral edge of said roughly circular metal seed layer is disposed in an undercut region.

9. The BLM structure of claim 7, wherein said roughly circular metal seed layer comprises Cu, said roughly circular metal base layer comprises TiW, and said barrier metal layer comprises Ni, a Ni alloy including any of Cr, Zn, Ag, and Au, and any of Cr, Zn, Ag, Au, and their alloys.

10. The BLM structure of claim 7, wherein:
said first section of said circumferential lateral edge of said roughly circular metal seed layer is aligned with a corresponding first section of a circumferential lateral edge of said roughly circular metal base layer.

11. The BLM structure of claim 10, said barrier metal layer covering said corresponding first section of said circumferential lateral edge of said roughly circular metal base layer.

12. The structure of claim 7, wherein a reflowed solder ball comprising any of a Sn-containing Pb-free solder, a Sn alloy-containing Pb-free solder, and a Pb-free solder, is disposed directly upon said barrier metal layer of said BLM structure.

13. A structure, comprising:
a semiconductor chip including a topmost passivation layer; and
a ball limiting metallurgy (BLM) structure, comprising:
a roughly circular metal base layer disposed directly on said topmost passivation layer;
a roughly circular metal seed layer disposed directly on said roughly circular metal base layer, said roughly circular metal seed layer including a top surface, a first section of a circumferential lateral edge oriented outwardly in a radial direction from a center of said semiconductor chip, and a second section of said circumferential lateral edge oriented inwardly toward said center; and
a barrier metal layer that directly covers said top surface of said roughly circular metal seed layer, directly contacts said first section of said circumferential edge, and does not directly contact said second section of said circumferential lateral edge of said roughly circular metal seed layer, and that directly contacts a corresponding first section of said circumferential edge of said roughly circular metal base layer and does not directly contact a corresponding second section of said circumferential lateral edge of said roughly circular metal base layer.

14. The BLM structure of claim 13, wherein said second section of said circumferential lateral edge of said roughly circular metal seed layer is disposed in an undercut region.

15. The BLM structure of claim 13, wherein said roughly circular metal seed layer comprises Cu, said roughly circular metal base layer comprises TiW, and said barrier metal layer comprises Ni, a Ni alloy including any of Cr, Zn, Ag, and Au, and any of Cr, Zn, Ag, Au, and their alloys.

16. The structure of claim 13, wherein a reflowed solder ball comprising any of a Sn-containing Pb-free solder, a Sn alloy-containing Pb-free solder, and a Pb-free solder, is disposed directly upon said barrier metal layer of said BLM structure.

* * * * *